US006292364B1

(12) United States Patent
Fitzgerald et al.

(10) Patent No.: US 6,292,364 B1
(45) Date of Patent: Sep. 18, 2001

(54) LIQUID SPRAY COOLED MODULE

(75) Inventors: Patrick J. Fitzgerald, Northridge; Steven G. Buczek, Brea; Frederick C. Rupp, Redondo Beach; Grace M. Christopher, El Segundo, all of CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/560,090

(22) Filed: Apr. 28, 2000

(51) Int. Cl.[7] ................................................ H05K 7/20
(52) U.S. Cl. ..................... 361/699; 62/259.2; 165/80.4; 165/908; 257/714
(58) Field of Search ............................... 361/818, 689, 361/699, 715–719, 784, 785, 790, 735; 200/307; 174/15.1, 35 R; 257/714; 62/64, 376, 259.2, 418, 419; 165/80.4, 104.19, 104.33, 908

(56) References Cited

U.S. PATENT DOCUMENTS

| 4,564,732 | * | 1/1986 | Lancaster et al. ................... 200/307 |
| 5,099,254 | * | 3/1992 | Tsukii et al. ........................ 343/853 |
| 5,220,804 |   | 6/1993 | Tilton et al. .                              |
| 5,718,117 | * | 2/1998 | McDunn et al. ......................... 62/64 |
| 5,761,035 | * | 6/1998 | Beise ..................................... 361/699 |
| 5,871,042 | * | 2/1999 | Gutfeldt et al. ....................... 165/70 |
| 5,907,473 | * | 5/1999 | Przilas et al. ........................ 361/699 |
| 5,943,211 | * | 8/1999 | Havey et al. ........................ 361/699 |
| 6,008,987 | * | 12/1999 | Gale et al. ........................... 361/700 |
| 6,108,201 | * | 8/2000 | Tilton et al. ......................... 361/689 |

* cited by examiner

Primary Examiner—Gerald Tolin
(74) Attorney, Agent, or Firm—Leonard A. Alkov; Glenn H. Lenzen, Jr.

(57) ABSTRACT

A radar system and method of cooling same. In the illustrative embodiment, the inventive system includes a radar array comprising a circuit board; a plurality of radiating elements printed on the circuit board; and a plurality of transmit and receive modules disposed on the circuit board in communication with the radiating elements. In a specific implementation, the invention further includes means for cooling the T/R modules. In the preferred embodiment, the modules are spray cooled. A particularly novel aspect of the invention is the provision of a mechanism for physically, electrically and hydraulically interconnecting the T/R modules or modules. The physical interconnect is achieved by rails mounted on the top bottom covers and sides of the circuit boards. The rails allow for the modules to be dovetailed together and thereby secured against vertical and lateral stresses.

2 Claims, 9 Drawing Sheets

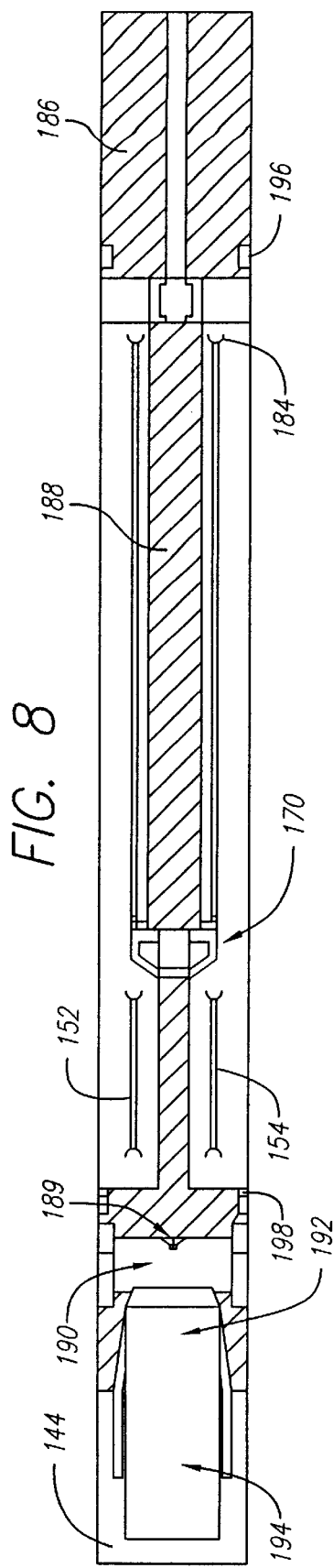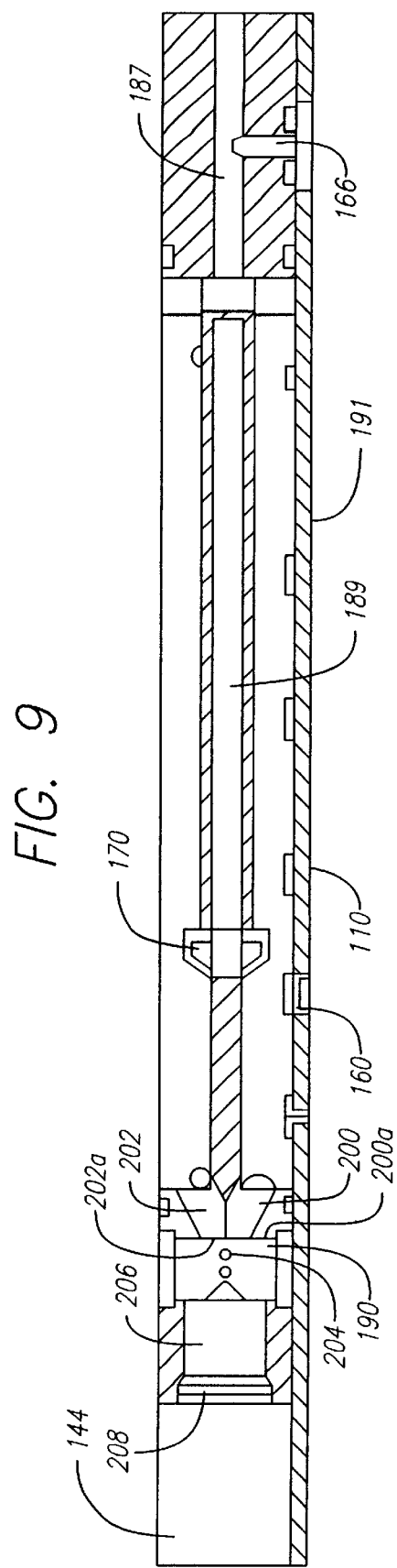

LIQUID SPRAY COOLED MODULE

This invention was made with Government support under a Government contract. The Government has certain rights in this invention.

BACKGROUND OF THE INVENTION

1. Field of the Invention

The present invention relates to antennas. More specifically, the present invention relates to methods and apparatus for cooling active array radar antennas.

2. Description of the Related Art

Active array antennas allow for electronic steering of a radar beam. Active array antennas include a plurality of antenna sub-arrays commonly referred to as 'sticks' comprising 20 to 30 radiating elements. The stick has a finite thickness and a heat exchanger located in a central portion thereof. The heat exchanger is designed to remove heat from circuit components, particularly the transmit/receive (T/R) modules mounted on either side thereof. Unfortunately, the finite length of the heat exchanger imposes some limitations on the system insofar as there is a need to pump coolant therethrough same. In addition, the heat exchanger imposes the more general requirements of fabrication, installation and removal. These considerations limit the optimal size of the exchanger.

An additional problem is due to the physical limitations of the RF (radio frequency) feed located at the back end of the stick. The RF feed is split to distribute power to each radiating element in the array. Each layer of power division requires more physical depth. Unfortunately, the T/R module is conventionally built into a small package. The heat exchanger has walls with a certain thickness. The heat developed within the T/R modules within the high power amplifier (HPA) is considerable due to the high power densities of the modules (on the order of hundreds of watts/sq. cm) and the high associated junction temperatures within the component. Removal of heat is problematic in that the heat must be moved through several thermal/resistant layers. The inherent inefficiencies of the electronic components causes the generation of large amounts of thermal energy, the thermal energy causes an increase in the junction temperatures of the associated components. As the junction temperatures increase, the reliability of the component decreases.

In addition, as the junction temperature is lowered, the overall efficiency of the HPA increases. Hence, as the temperature of the HPA is lowered, the input powered required for a given amount of radiated output power is lowered as well. This is important for aircraft applications where power generation is limited.

Those skilled in the art will appreciate that the critical parameter is area, viz., the footprint of the HPA component verses the thermal resistance of the areas from which heat is being removed.

In addition, conventionally, the components of a T/R module are placed on a substrate mounted within a housing and the T/R module is attached to the heat exchanger. The housing is typically of metallic construction. The module must be physically attached to a sub-array using one of a number of mechanical attachment mechanisms (solder, bolts, etc.). Differing coefficients of thermal expansion between the module and the heat exchanger will cause the expansion and contraction of the heat exchanger to damage the module and/or break a bond line therebetween.

Another consideration has to do with thermal mismatch between a component of a T/R module and its substrate.

Further, lattice spacing is the location of one radiating element relative to the next. Smaller lattice spacing leads to a higher number of T/R modules and a higher antenna output power. Lattice spacing is also driven by antenna operating frequency. Unfortunately, lattice spacings of active array antennas designed in accordance with conventional teachings are constrained based on the projected footprint of the T/R module, notwithstanding the desirability of more flexible lattice spacing arrangements to accommodate frequency.

In summary, there are several problems with the conventional active array antenna design including: high heat density, excessive layers of thermal resistance, physical component assembly, mounting the T/R module to the subarray, lattice spacing, and thermal mismatch.

Hence, there is a need in the art to make smaller HPA components within T/R modules in radar and other electrical systems to achieve smaller denser lattice spacings. There is a further need for a system and technique to more efficiently remove heat from such components. There is also a compelling need to reduce the cost of radar antenna assemblies.

SUMMARY OF THE INVENTION

The need in the art is addressed by the radar system and method of cooling of the present invention. In the illustrative embodiment, the inventive system includes a radar array comprising a circuit board; a plurality of radiating elements printed on the circuit board; and a plurality of transmit and receive modules disposed on the circuit board in communication with the radiating elements. In a specific implementation, the invention further includes means for cooling the modules. In the preferred embodiment, the modules are spray cooled.

A particularly novel aspect of the invention is the provision of a mechanism for physically, electrically and hydraulically interconnecting the modules. The physical interconnect is achieved by rails mounted on the top and sides of the circuit boards. The rails allow for the modules to be dovetailed together and thereby secured against vertical and lateral stresses.

BRIEF DESCRIPTION OF THE DRAWINGS

FIG. 8 is a sectional side view of the cooling system cover of FIG. 2 taken along the line 8—8 thereof.

FIG. 9 is a sectional side view of the cooling system cover and PCB of FIG. 2 taken along the line 9—9 thereof.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
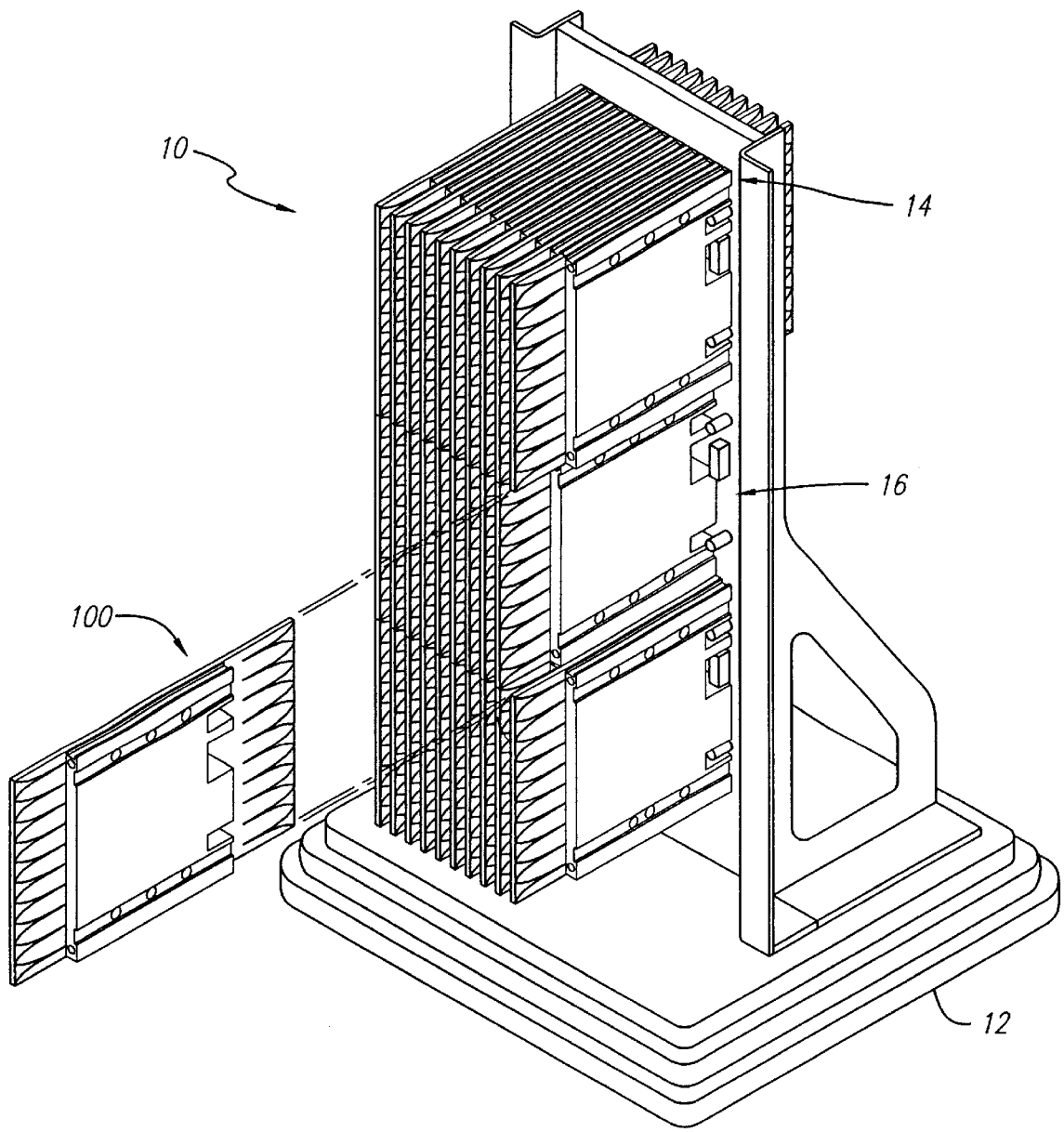
FIG. 1 is a diagram showing an assembly of spray cooled modules in accordance with the teachings of the present invention, to form an antenna.

FIG. 1 is a diagram showing an assembly of T/R modules in accordance with the teachings of the present invention. The assembly 10 includes a base 12, which supports a shear panel 14. FIG. 1 shows the typical assembly/interlocking modules assembled to create a portion antenna aperture. Using this interlocking method an N×M array can be constructed. Approximately 30 single sided modules 100 (of which one is removed) are interfaced to the shear panel 14 of the assembly of FIG. 1. Those skilled in the art will appreciate that the teachings of the present invention are not limited to 30 modules. Any N×M array can be built, where N and M are integers, without departing from the scope of the present teachings. The shear panel 14 supports a module interface 16, which is plug compatible with each module 100.

Figure 2:
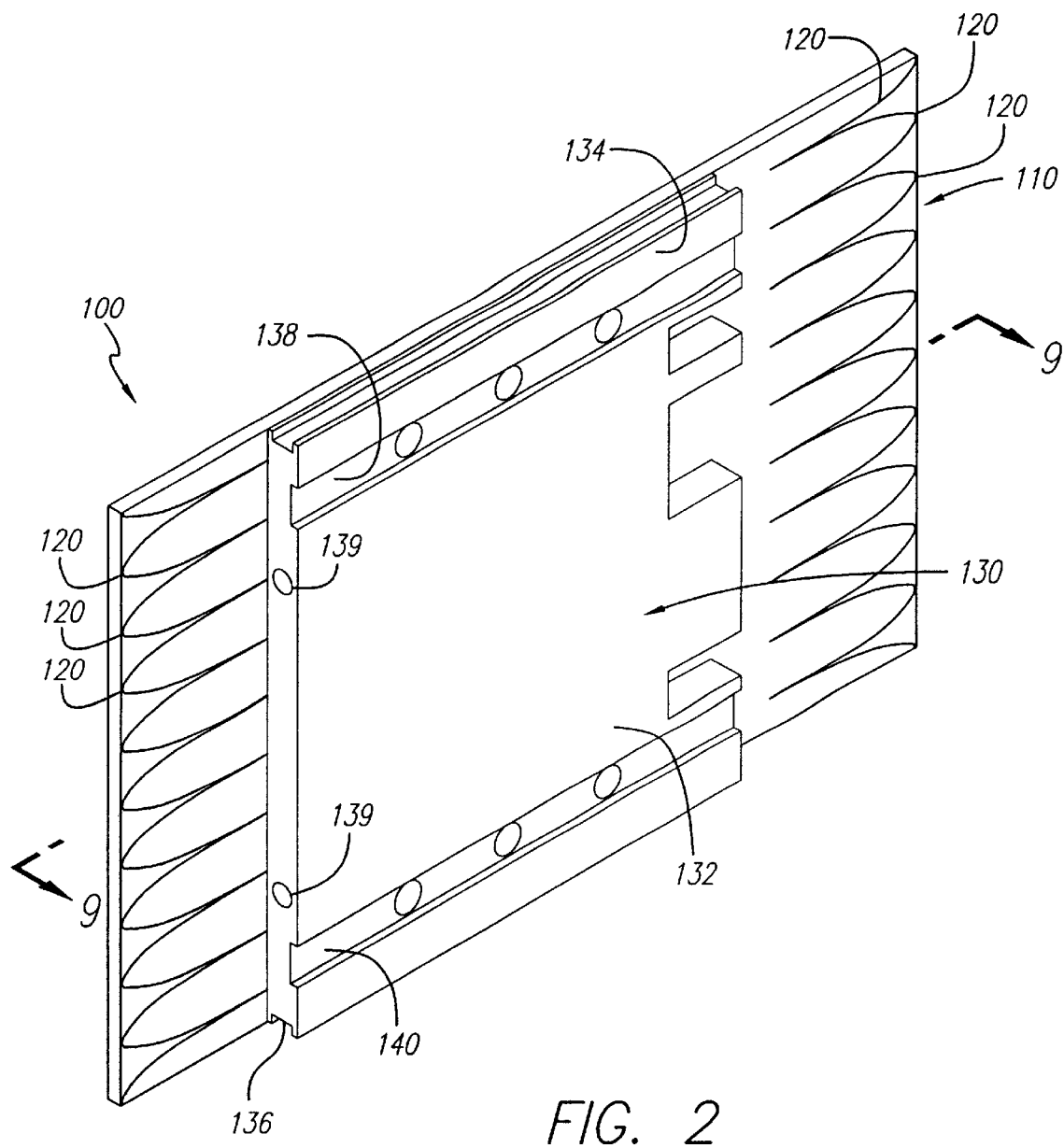
FIG. 2 is a diagram of a single module in accordance with the teachings of the present invention.

FIG. 2 is a diagram of a single module in accordance with the teachings of the present invention. The module 100 includes a single printed circuit board 110 on which a plurality of individual radiating elements 120 are disposed. The printed circuit board 110 may be of conventional design, fabrication and construction e.g., fiberglass, Teflon®, Duroids etc. Those skilled in the art will appreciate that the invention is not limited to the design of the radiating elements shown. Numerous antenna patterns may be used without departing from the scope of the present teachings.

A plurality of components (not shown in FIG. 2) are mounted on the circuit board 110 in electrical communication with the radiating elements 120. Heat generated by these components is dissipated by a cooling system 130. The cooling system 130 is disposed beneath a cover 132.

FIG. 1 shows the modular nature and interlocking capabilities of the structure 10. As shown in FIG. 2, and in accordance with the present teachings, the modular and interlocking capabilities are afforded by the provision of upper (134), lower (136) and lateral (138 and 140) integrated guide rails can be molded, machined or attached into each cover 132 of each module 100. Holes 139 are provided for jackscrews.

FIG. 1 shows the typical assembly/interlocking modules assembled to create a portion of the antenna aperture. As mentioned above, using this interlocking method, an N×M array can be constructed.

Figure 3:
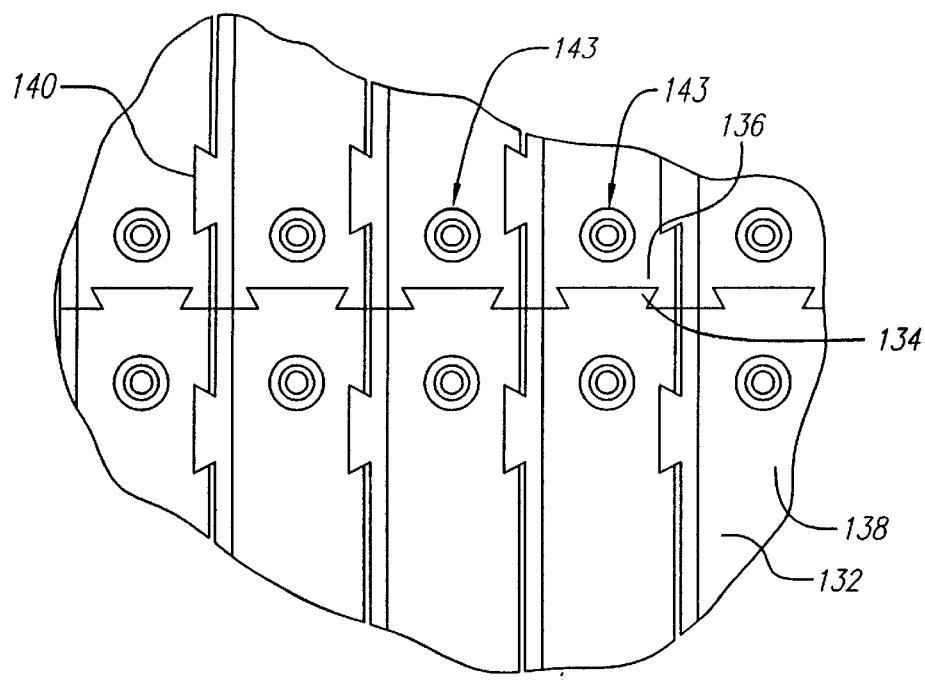
FIG. 3 is a diagram that illustrates how the rails of each module interlock in a dovetail manner to secure the modules against vertical, horizontal (lateral) and rotational stresses.

FIG. 3 is a diagram that illustrates how the rails 134–140 of each module interlock in a dovetail manner to secure the modules 100 against vertical, horizontal (lateral) and rotational stresses. The modules 100 are secured in place via jackscrews 143 that serve to hold the modules to a coolant distribution panel as discussed more fully below.

In FIG. 3, it is understood that a second cover 132 would be disposed on the back side of each board as would be the case with the alternative module implementation of FIG. 4 below which shows a dual printed circuit board construction.

Figure 4:
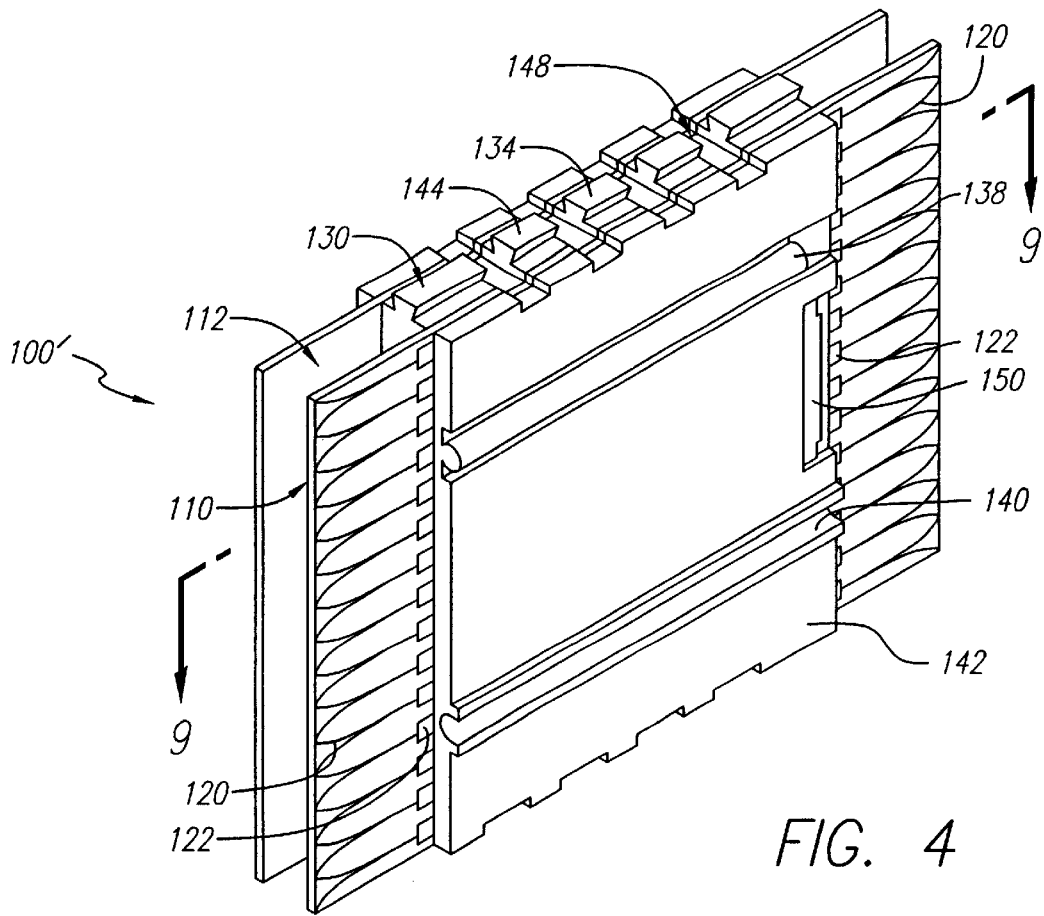
FIG. 4 is a diagram, which depicts a dual circuit board construction of a T/R module constructed in accordance with the teachings of the present invention.

FIG. 4 is a diagram, which depicts a dual circuit board construction of a T/R module constructed in accordance with the teachings of the present invention. The module 100' of FIG. 4 includes first and second printed circuit boards 110 and 112 mounted back-to-back on either side of a center cover 144 of a cooling system 130. The boards 110 and 112 are secured to each other with snap clips 148 or bolts or other suitable attachment mechanism. The embodiment of FIG. 4 enables two circuit boards to be cooled by one cooling system 130. In addition, the design of FIG. 4 enables the inlet and outlet to be distributed to prevent interference with the respect flow paths as discussed more fully below. A front cover 142 is provided along with a back cover 146 (not shown in FIG. 4). Note the provision of the top rail 134. Note the provision of male and female lateral rails 138 and 140, respectively, and a DC signal connector 150. Note also the provision of the printed feed radiators 120 and printed aperture radiators 122.

Figure 5:
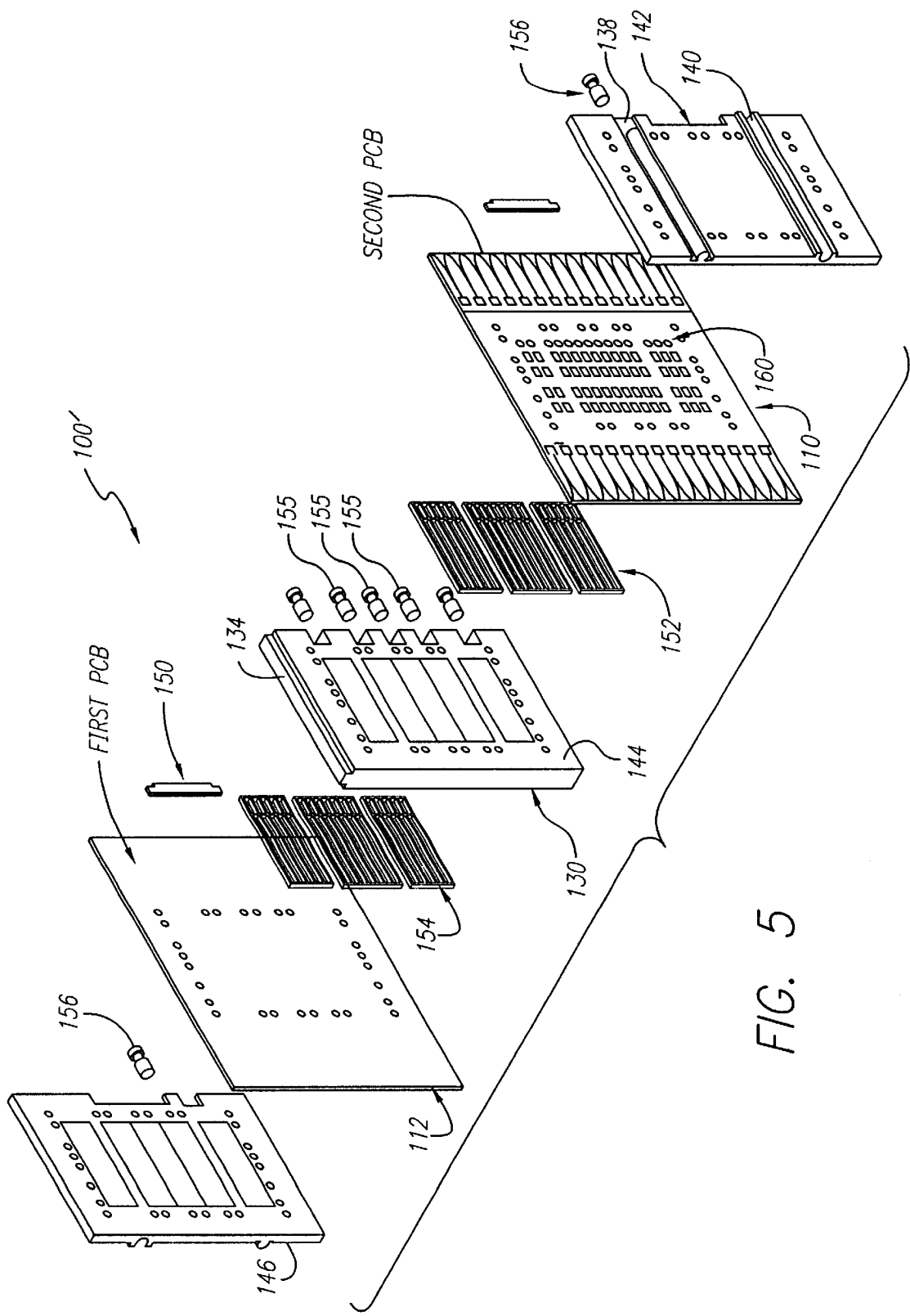
FIG. 5 is an exploded view of the T/R module of FIG. 4.

FIG. 5 is an exploded view of the T/R module 100' of FIG. 4. First and second electromagnetic interference shield inserts 152 and 154 are provided to protect the T/R components from electromagnetic interference. In practice, the shield inserts 152 and 154 may be implemented with a single element. An inlet quick disconnect 156 is shown along with a plurality of recovery quick disconnects 155. The T/R modules are shown generally at 160. Boltholes are shown in the exploded view of FIG. 5, in lieu of the snap clips 148 of FIG. 4, for the purpose of illustration.

Figure 6:
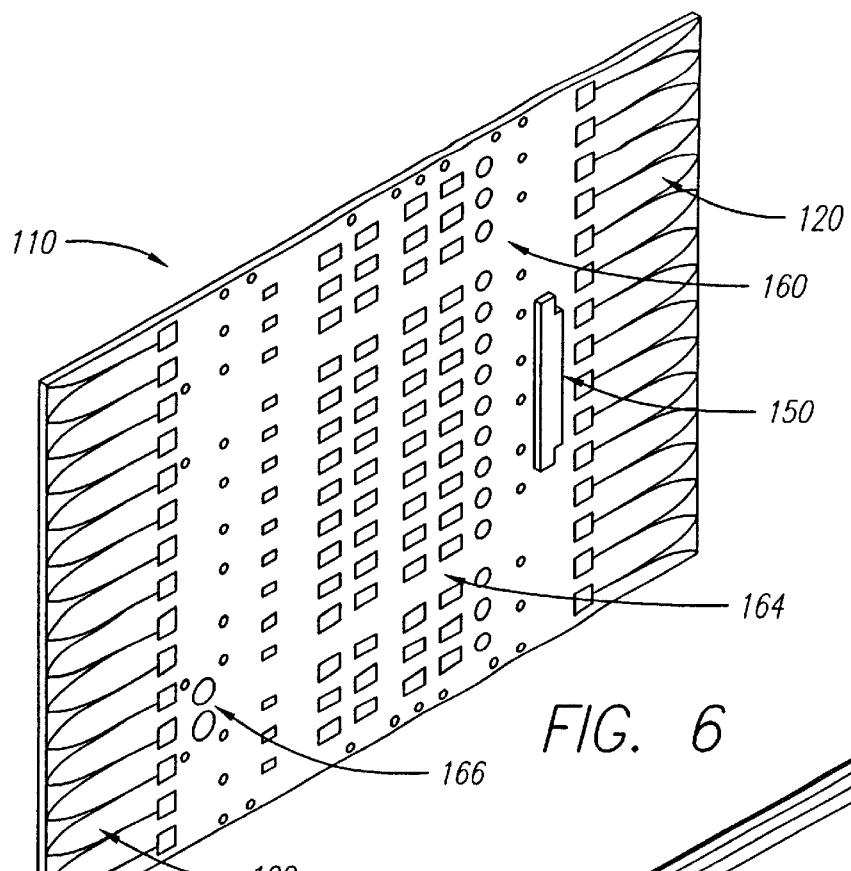
FIG. 6 is a diagram showing one of the printed circuit boards of FIGS. 4 and 5.

FIG. 6 is a diagram showing one of the printed circuit boards of FIGS. 4 and 5. The board 110 includes printed flared radiators 120, T/R components 160, the DC signal connector 150, clearance for a structural septum 164 an access for a coolant supply crossover 166 and printed feed radiators 122. In accordance with the present teachings, all of the T/R components required for a radar system are integrated onto the printed circuit board. In addition, the printed radiators 122 form first level feeds for the radiating elements 120.

Figure 7A:
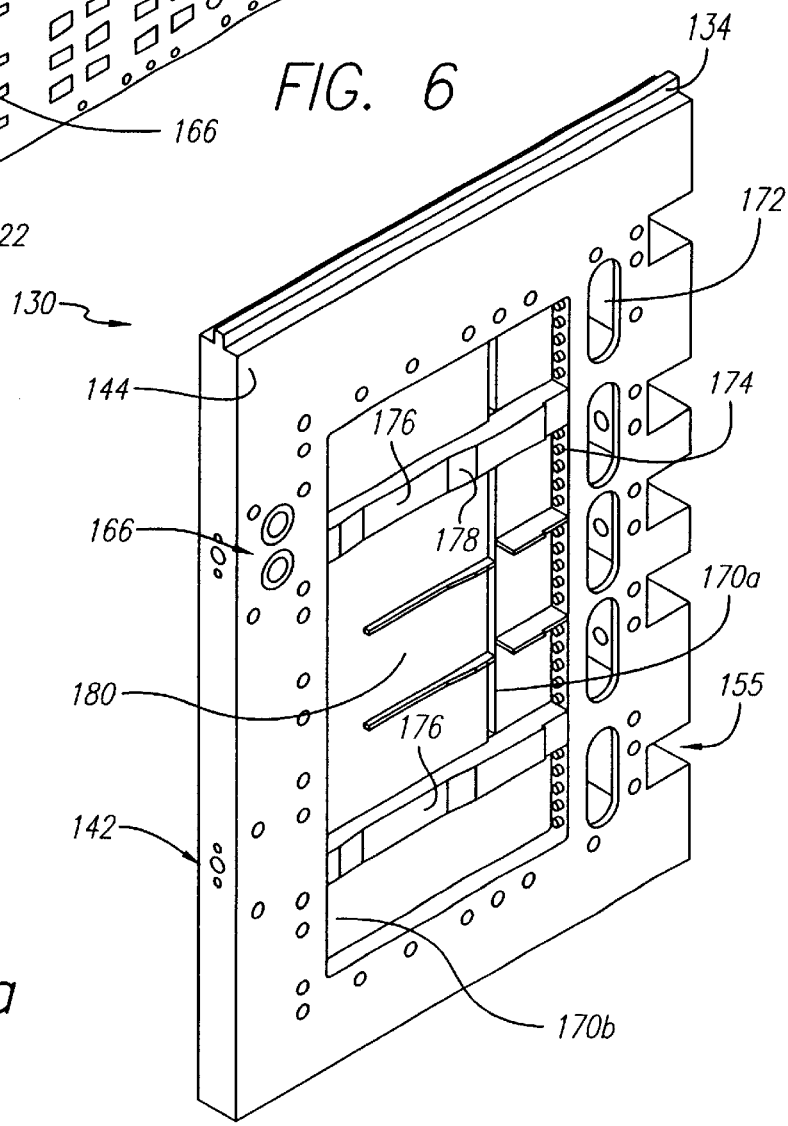
FIG. 7a is an isolated, rear perspective view of the center spray cover of the cooling system constructed in accordance with the teachings of the present invention.

FIG. 7a is an isolated, rear perspective view of the center spray cover 144 of the cooling system 130 constructed in accordance with the teachings of the present invention. In accordance with the present teachings, coolant is sprayed onto the components 160 by a cooling system 130 to remove heat generated by the components 160. The cooling system 130 is disposed within the center cover and includes a plurality of nozzles 170. Each of the nozzles 170 receives coolant via the distribution channels provided in the center cover 144 and sprays the coolant onto the components 160 as disclosed more fully below. The coolant is brought into the center spray cover by two inlets 166. From the inlet 166, the coolant moves into a plenum or chamber. The chamber provides a means to distribute the coolant along the length of the inlet 166 to the rear nozzles 170b. One rear nozzle is provided for each channel. The septum 176 has a hole bored down its length. This hole provides a means for the jackscrew to pass through the inlet 166. A cavity formed in the inlet 166 provides means for the coolant to be moved from the chamber to the HPA distribution chambers and thus to the HPA nozzles 170*a*.

A coolant recovery chamber 172 is provided within the center cover 144 along with a plurality of collector holes 174 and a structural septum 176. The center cover 144 is provided with a cross vent cutout in the septum 176. Note the provision of a component chamber area 180.

Figure 7B:
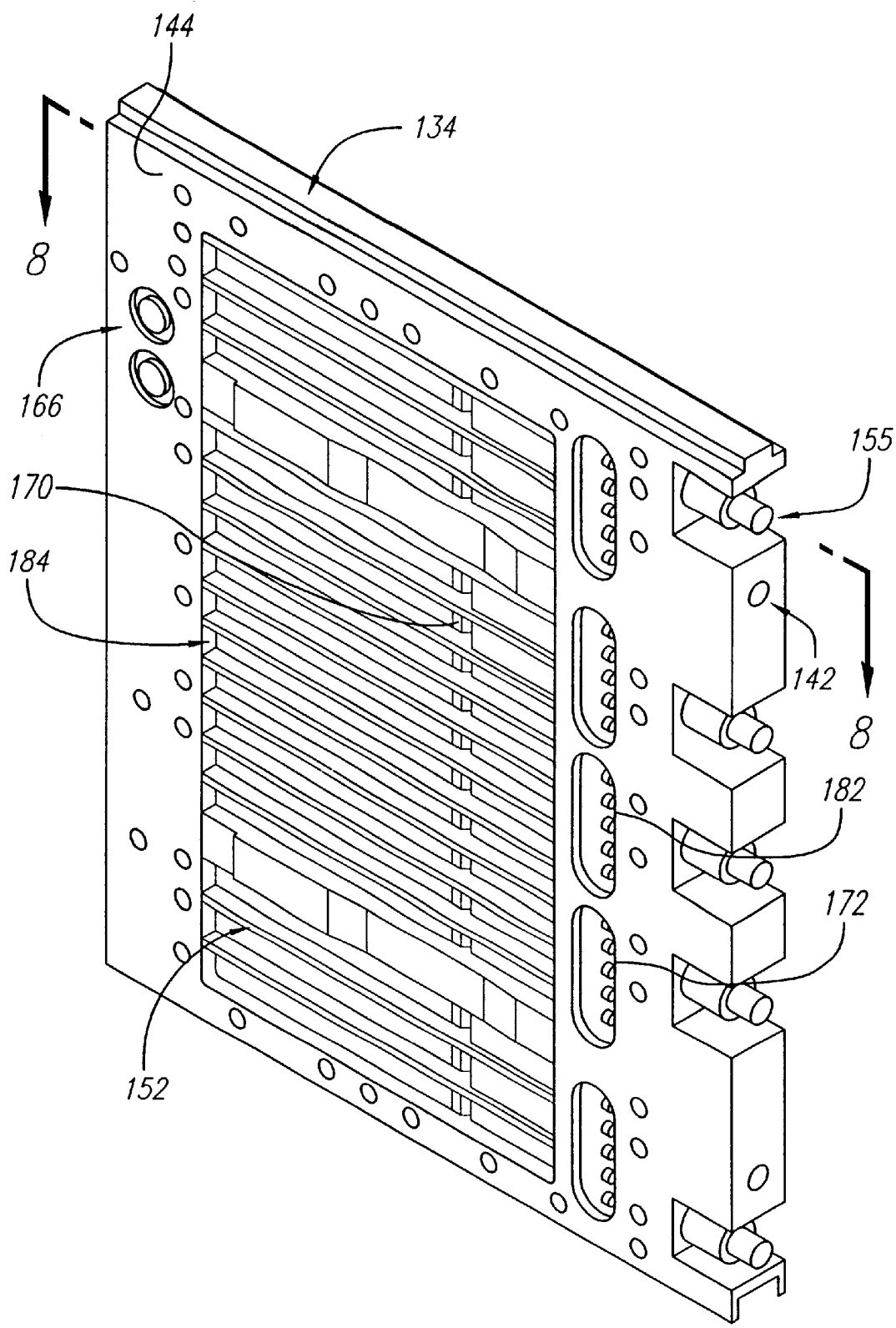
FIG. 7b is an isolated, front perspective view of the center spray cover of the cooling system constructed in accordance with the teachings of the present invention.

FIG. 7*b* is an isolated, front perspective view of the center spray cover 144 of the cooling system 130 constructed in accordance with the teachings of the present invention. The rear perspective view of FIG. 7*b* shows a coolant outlet 182 and an aft nozzle 184 within the cover 144. The electromagnetic-interference shield insert 152 is shown in place.

FIG. 8 is a sectional side view of the cooling system cover 144 of FIG. 7*b* taken along the line 8—8 thereof. FIG. 9 is a sectional side view of the cooling system cover 144 and 110 of FIG. 4 taken along the line 9—9 thereof. In FIGS. 8 and 9, reference is made to the cover 144 of FIG. 4 to assist the reader. The sectional view of FIG. 8 shows a first (main) fluid delivery module 186 which communicates with a second (HPA) fluid delivery manifold 188. The second manifold 188 communicates coolant to the HPA nozzles 170. The sectional view of FIG. 9 reveals the main coolant plenum 187 and the HPA supply plenum 189.

Figure 10:
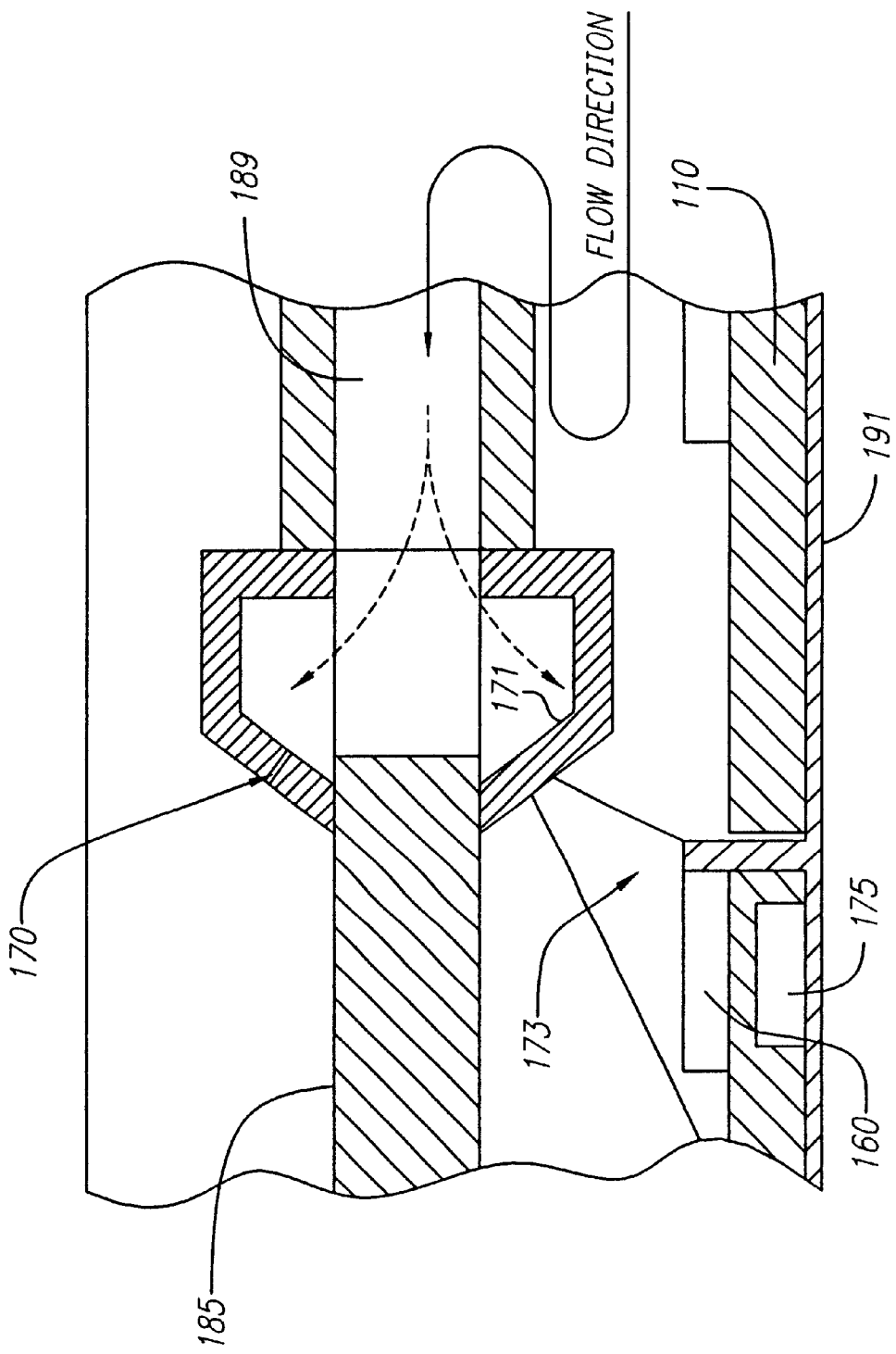
FIG. 10 is a magnified view showing the HPA nozzle in greater detail.

FIG. 10 is a magnified view showing the HPA nozzle in greater detail. The nozzle 170 receives coolant via the supply plenum 189 and ejects the coolant through an aperture 171 in said nozzle to spray a cone of vapor or mist onto the components 160 mounted on the board 110.

Returning to FIGS. 8 and 9, the vapor flows over the components and is collected by inlets 200 and 202 and moves via fluid outlets 200*a*, 202*a* into a collection chamber 190. Within the collection chamber 190 is a cross-over pressure equalization aperture 204. The crossover pressure equalization apertures 224 allow for the hydraulic communication of fluid therebetween. The outputs of the component chambers are 180. A second chamber 206 leads to a coolant quick disconnect plumbing fixture 208 such as that sold by the Aeroquip Corporation.

Figure 11:
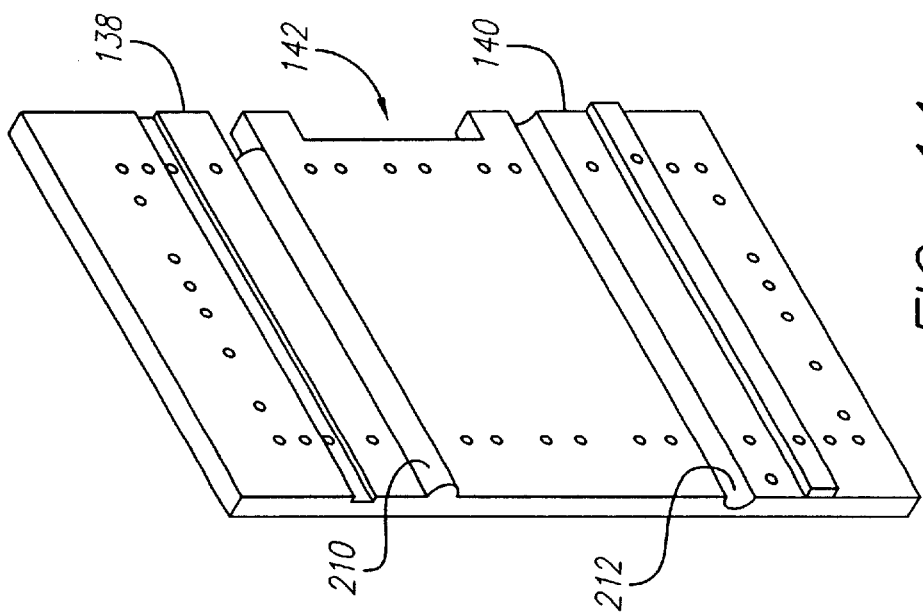
FIG. 11 is a detailed view of the front cover of the cooling system of the present invention.

FIG. 11 is a detailed view of the outer cover of the cooling system of the invention. The covers 142, 144 and 146 are made of plastic or other suitable material. Note the provision of a molded supply inlet 210 and a recess 212 for the supply inlet of the next adjacent spray cooled module 100'.

Figure 12:
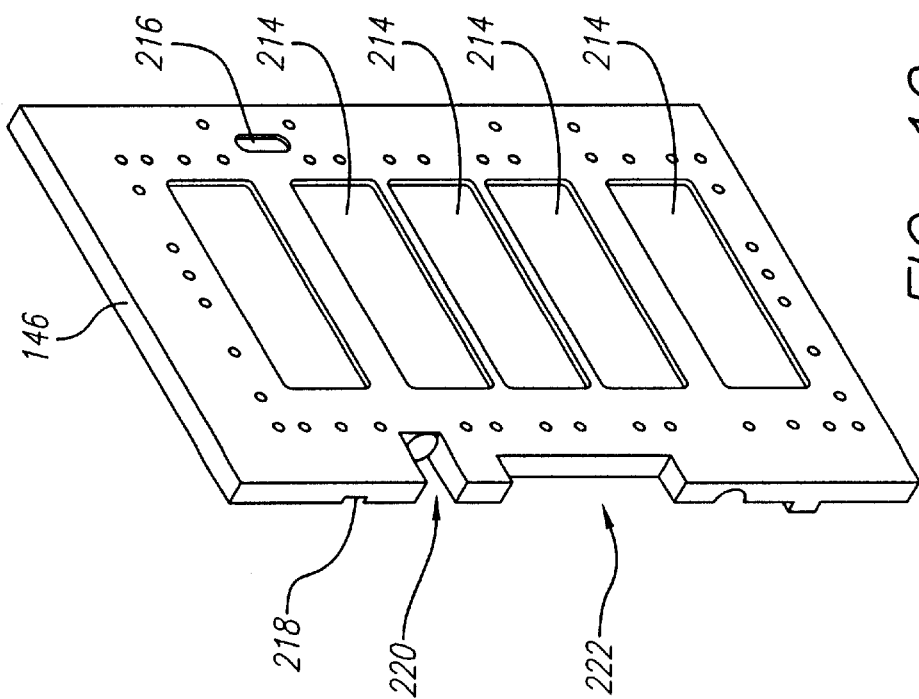
FIG. 12 is a detailed view of the back cover of the cooling system of the present invention.

FIG. 12 is a detailed view of the inside of the outer cover of the cooling system of the present invention. The outer cover 146 includes side clearance areas for uncooled electronic components 214, a supply crossover aperture 216, a lateral guide 218, a supply inlet quick disconnect 220 and a cutout for a DC signal connector 222.

In the preferred embodiment, liquid such as FC-72 by Florinert is used as a coolant. Those skilled in the art will appreciate that other coolants could be used such as water or inert liquids.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly, What is claimed is:

1. A spray cooled assembly comprising a plurality of spray cooled modules, each module including:

a printed circuit board and an interlocking cover mated with the printed circuit board, said cover having:

means for spray cooling said printed circuit board, and means for providing interlocking engagement with an adjacent module, said means for providing interlocking engagement including:

a first rail and a first channel, said first channel receiving a first rail of a mating interlocking cover, said first rail and said first channel being mounted in parallel with a longitudinal axis of each said cover for securing said module against lateral stresses and a second rail and a second channel, said second channel receiving a second rail of a mating interlocking cover, said rail and said channel being mounted transverse with respect to a longitudinal axis of each said cover for securing said module against vertical stresses, and means for providing electromagnetic shielding for said printed circuit board.

2. The invention of claim 1 further including transmit and receive modules mounted on said printed circuit board.

* * * * *